(12) United States Patent
Miyamura et al.

(10) Patent No.: US 6,646,341 B2
(45) Date of Patent: Nov. 11, 2003

(54) HEAT SINK APPARATUS UTILIZING THE HEAT SINK SHROUD TO DISSIPATE HEAT

(75) Inventors: Harold Miyamura, San Jose, CA (US); Christopher G. Malone, Folsom, CA (US)

(73) Assignee: Hewelett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/080,010

(22) Filed: Feb. 20, 2002

(65) Prior Publication Data

US 2003/0155637 A1 Aug. 21, 2003

(51) Int. Cl.[7] ............................................. H01L 23/34
(52) U.S. Cl. ..................... 257/719; 257/712; 257/717; 257/718; 257/675
(58) Field of Search ................................ 257/719, 712, 257/717, 718, 675

(56) References Cited

U.S. PATENT DOCUMENTS

| | | | | |
|---|---|---|---|---|
| 5,630,469 A | * | 5/1997 | Butterbaugh et al. | 165/80.3 |
| 5,936,836 A | * | 8/1999 | Scholder | 361/695 |
| 6,212,074 B1 | * | 4/2001 | Gonsalves et al. | 361/717 |
| 6,352,103 B1 | * | 3/2002 | Chu et al. | 165/80.3 |
| 6,377,459 B1 | * | 4/2002 | Gonsalves et al. | 361/700 |
| 2002/0093255 A1 | * | 7/2002 | Matsumoto | 310/64 |

* cited by examiner

Primary Examiner—David Nelms
Assistant Examiner—Tu-Tu Ho

(57) ABSTRACT

In one embodiment, the present invention is a heat sink apparatus comprising a heat sink device and a heat sink shroud. The heat sink device is for transferring heat from a heat source. The heat sink shroud is thermally coupled with the heat sink device. Hence, the heat sink shroud transfers heat from the heat sink device and dissipates the heat generated by the heat source.

26 Claims, 11 Drawing Sheets

300

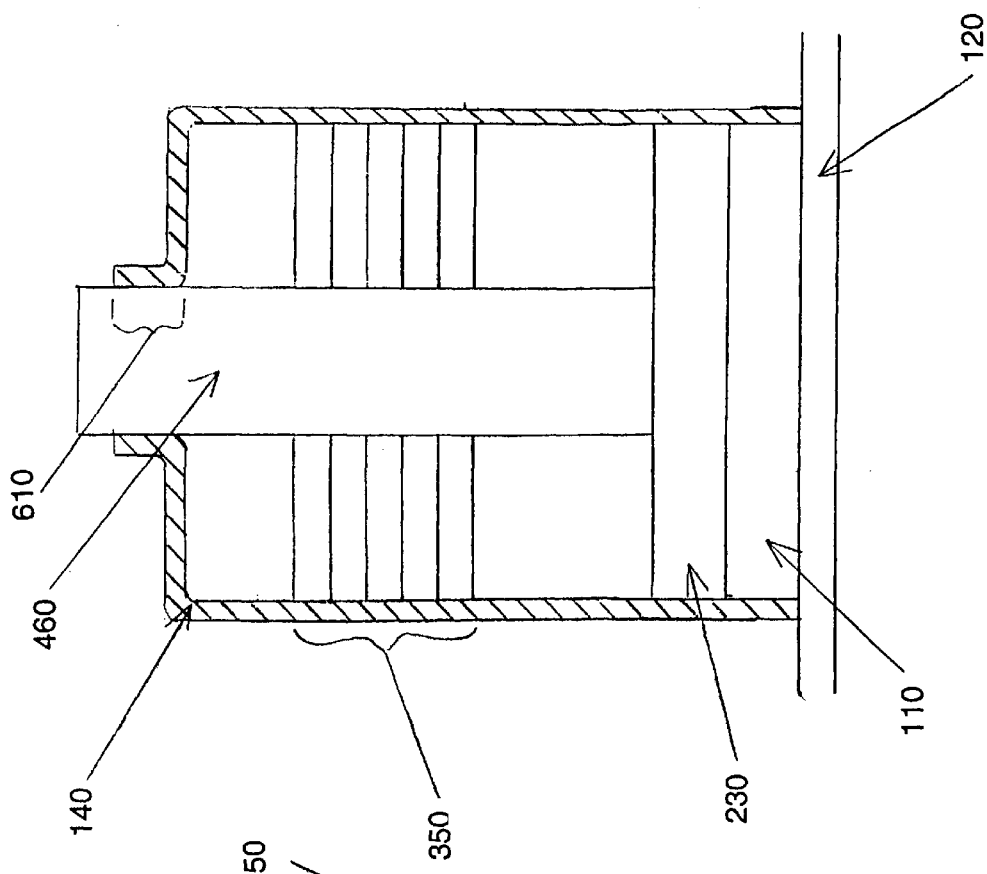
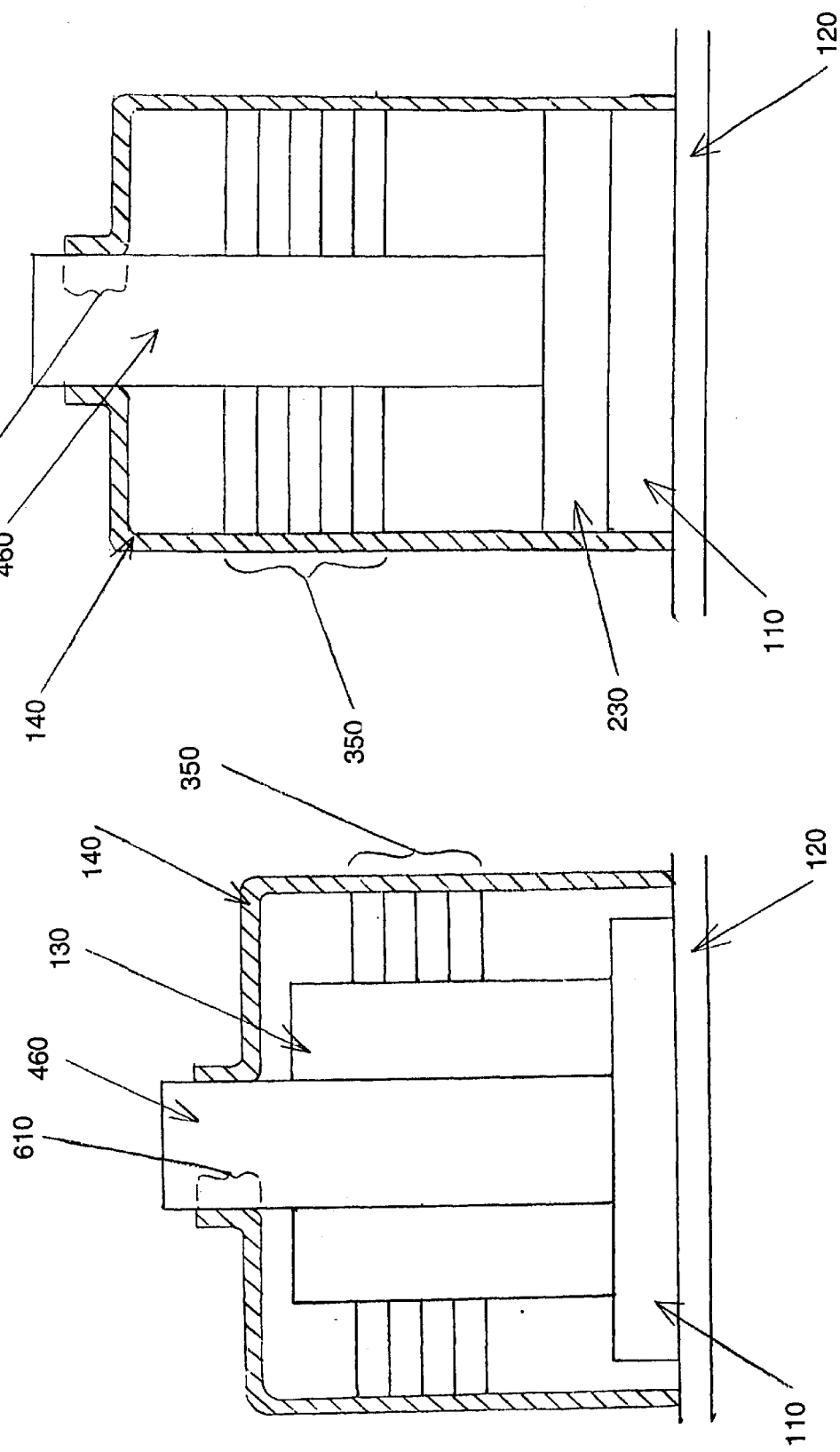

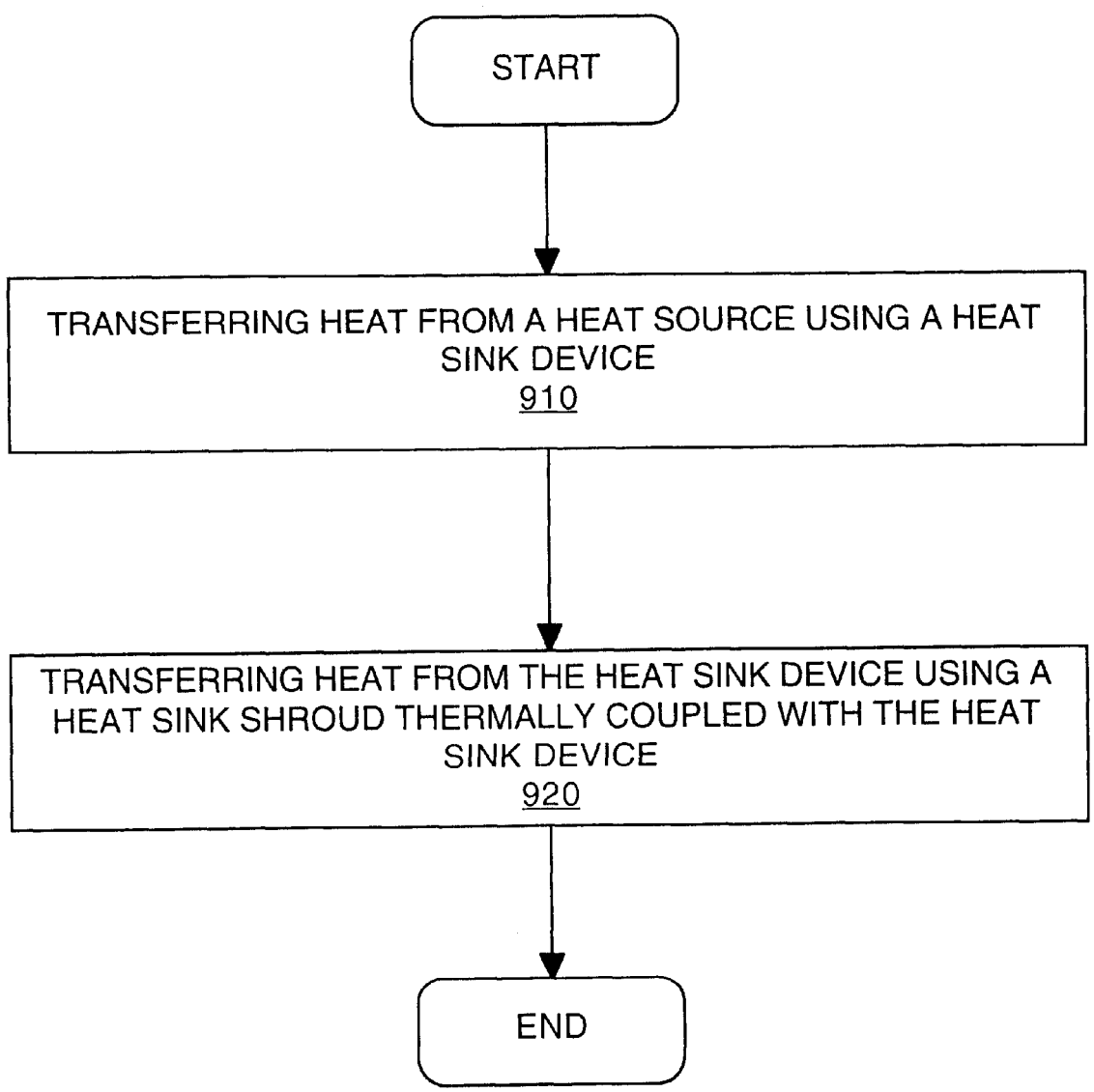

HEAT SINK APPARATUS UTILIZING THE HEAT SINK SHROUD TO DISSIPATE HEAT

TECHNICAL FIELD

The present invention relates to the field of heat removal devices. More specifically, embodiments of the present invention relate to heat sinks employing heat shrouds.

BACKGROUND ART

The performance reliability and life expectancy of electronic equipment are related to the component temperature of the equipment. As the temperature of the equipment rises, there is an exponential decrease in the reliability and life expectancy of the device. Therefore, designers try to enhance the reliability and life expectancy of their components by effectively controlling the device operating temperature.

As integrated circuit (IC) chip densities increase, the amount of heat generated by the IC chip also increases. Removing the excess heat generated by the IC chip is necessary to insure proper operation. More specifically, if the excess heat is not removed, the excess heat can literally burn-up and destroy the IC chip. Technology trends are driving IC designs toward higher powered IC chips which give off more and more heat and make efficient removal of excess heat a critical design issue.

Additionally, technology trends are creating more compact computer architectures with system components being located closer to the processor. As CPU speeds continue to increase, it is becoming more important to locate ancillary devices closer to the CPU to provide faster access times. This is especially true with multi-processor systems where it is desirable to locate the processors as close as possible to each other in order to get optimal performance. This frequently leads to design problems in trying to fit cooling devices into a more densely packed architecture. More specifically, there is less room for cooling fins or other structures used to increase the surface area of cooling devices. Thus, the problem facing design engineers is to remove increasing amounts of excess heat while being allotted less space for heat dissipation devices.

DISCLOSURE OF THE INVENTION

Embodiments of the present invention provide a heat sink apparatus which can dissipate greater amounts of heat without increasing the size of the apparatus. Furthermore, embodiments of the present invention can provide a given level of heat dissipation while reducing the amount of space required for heat dissipation devices.

In one embodiment, the present invention is a heat sink apparatus comprising a heat sink device and a heat sink shroud. The heat sink device is for transferring heat from a heat source. The heat sink shroud is thermally coupled with the heat sink device. Hence, the heat sink shroud transfers heat from the heat sink device and dissipates the heat generated by the heat source.

BRIEF DESCRIPTION OF THE DRAWINGS

The accompanying drawings, which are incorporated in and form a part of this specification, illustrate embodiments of the present invention and, together with the description, serve to explain the principles of the invention. Unless specifically noted, the drawings referred to in this description should be understood as not being drawn to scale.

FIGS. 7A and 7B are cross section views of exemplary finned heat sink devices which include heat pipes and utilize a flange equipped heat sink shroud for dissipating heat in accordance with embodiments of the present invention.

FIG. 9 is a flow chart of a method for dissipating heat in accordance with embodiments of the present invention.

MODES FOR CARRYING OUT THE INVENTION

Reference will now be made in detail to embodiments of the present invention, examples of which are illustrated in the accompanying drawings. While the present invention will be described in conjunction with these embodiments, it will be understood that they are not intended to limit the present invention to these embodiments. On the contrary, the present invention is intended to cover alternatives, modifications, and equivalents, which may be included within the spirit and scope of the present invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, and components have not been described in detail so as not to unnecessarily obscure aspects of the present invention.

Figure 1A:
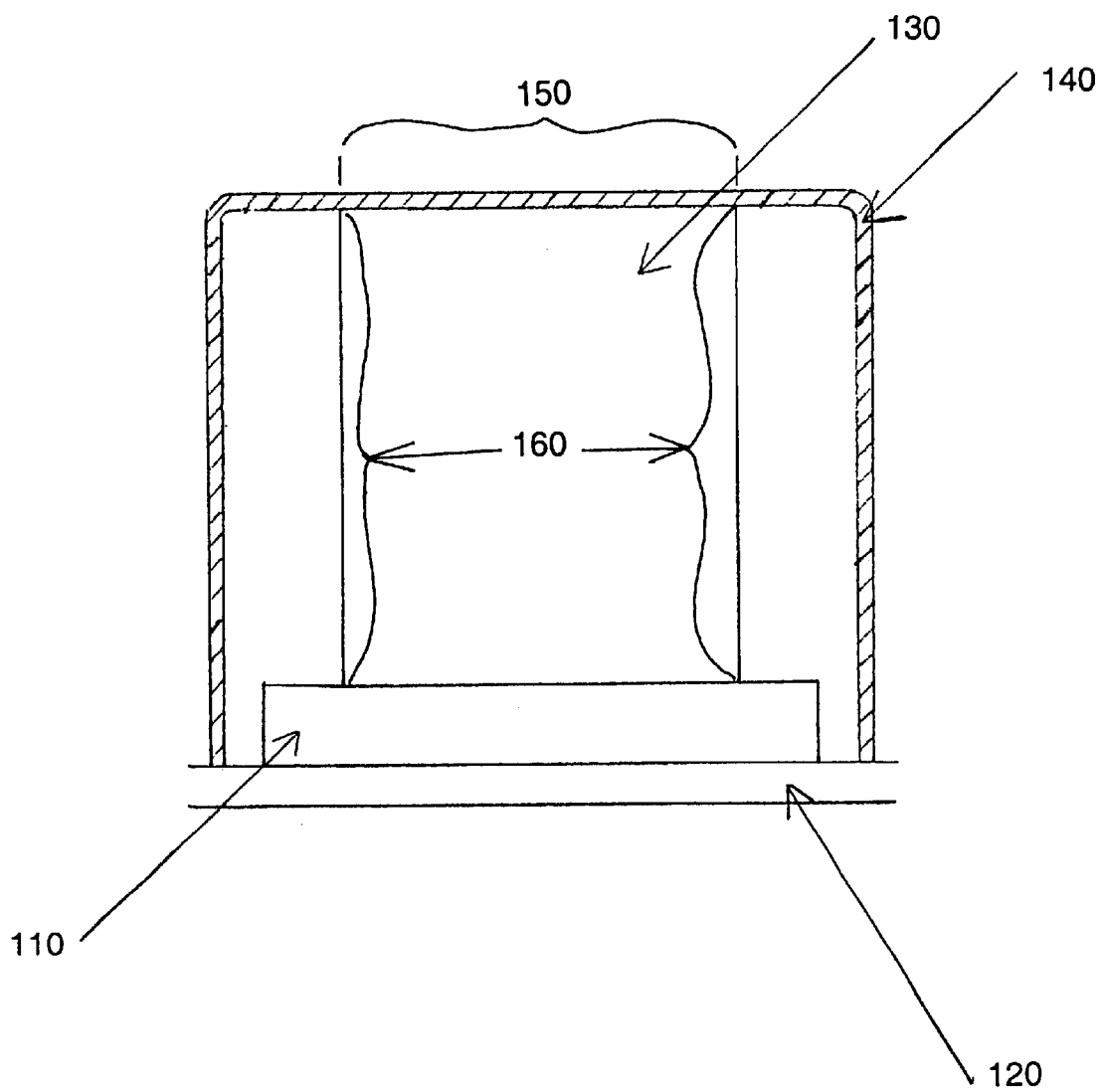
FIGS. 1A, 1B, and 1C are cross section views of an exemplary heat sink apparatus including a heat sink shroud for dissipating heat in accordance with embodiments of the present invention.

FIG. 1A is a cross section view of an exemplary heat sink apparatus 100 which utilizes a heat sink shroud to dissipate heat in accordance with one embodiment of the present invention. As shown in FIG. 1A, a heat source 110 (e.g., a microprocessor) is coupled with a substrate 120 (e.g., a motherboard). Although the present embodiment recites a microprocessor and a motherboard, the present invention is well suited for dissipating heat from a heat source other than a microprocessor which is coupled with a substrate other than a motherboard. A heat sink device 130 is adapted to have the bottom surface thereof placed in thermal contact with heat source 110. Heat generated by heat source 110 is transferred to heat sink device 130 and dissipated.

In one embodiment of the present invention, heat sink device 130 may be shaped or provided with structures to increase its surface area in order to facilitate dissipating heat from heat source 110. Furthermore, a layer of thermally conductive material may be disposed between heat source 110 and heat sink device 130 to facilitate heat transfer to heat sink device 130. In one embodiment, a thermally conductive layer of material such as a high molecular weight interface material thermally couples the top surface of heat source 110 with the bottom surface of heat sink device 130. Although heat sink device 130 and heat source 110 are thermally coupled as described above in the present embodiment, the present invention is also well suited to various other approaches for coupling heat sink device 130 with heat source 110.

Heat sink apparatus 100 of the present embodiment is further comprised of a heat sink shroud 140 which provides mechanical strength and stability to heat sink apparatus 100. Specifically, heat sink shroud 140 provides a method for coupling heat sink apparatus 100 with substrate 120. Additionally, as shown in the embodiment of FIG. 1, the bottom surface of heat sink shroud 140 is thermally coupled with the top surface of heat sink device 130 in top region 150. In another embodiment, the side surfaces of heat sink shroud 140 are also thermally coupled with the side surfaces of heat sink device 130 in side regions 160. Furthermore, a layer of thermally conductive material such as a metal to metal interface, a high molecular weight interface material, soldering, metal mesh or other metallic bonding methods may be disposed between heat sink device 130 and heat sink shroud 140 in top region 150 and side regions 160 to facilitate heat transfer to heat sink shroud 140.

As shown in FIG. 1A of the present embodiment, heat sink shroud 140 is adapted to be thermally coupled with heat sink device 130. In one embodiment of the present invention, heat sink shroud 140 may be made of copper. In another embodiment, heat sink shroud 140 may be made of aluminum. While the present embodiment recites copper or aluminum, it is appreciated that heat sink shroud 140 may be comprised of a variety of materials which are well suited for transferring heat from heat sink device 130 and dissipating the heat into an ambient flow such as, for example, air.

Referring still to the embodiment of FIG. 1A, thermally coupling heat sink shroud 140 with heat sink device 130 allows heat to be transferred to heat sink shroud 140 which then provides additional surface area for dissipating heat. Thus, the present invention provides a heat sink apparatus in which the heat sink shroud not only provides features of, for example, increasing mechanical strength, protecting delicate fins during shipping and installation, and constraining the ambient flow to ensure maximum cooling, but also transfers heat from the heat sink device and dissipates it into the ambient.

Figure 1B:
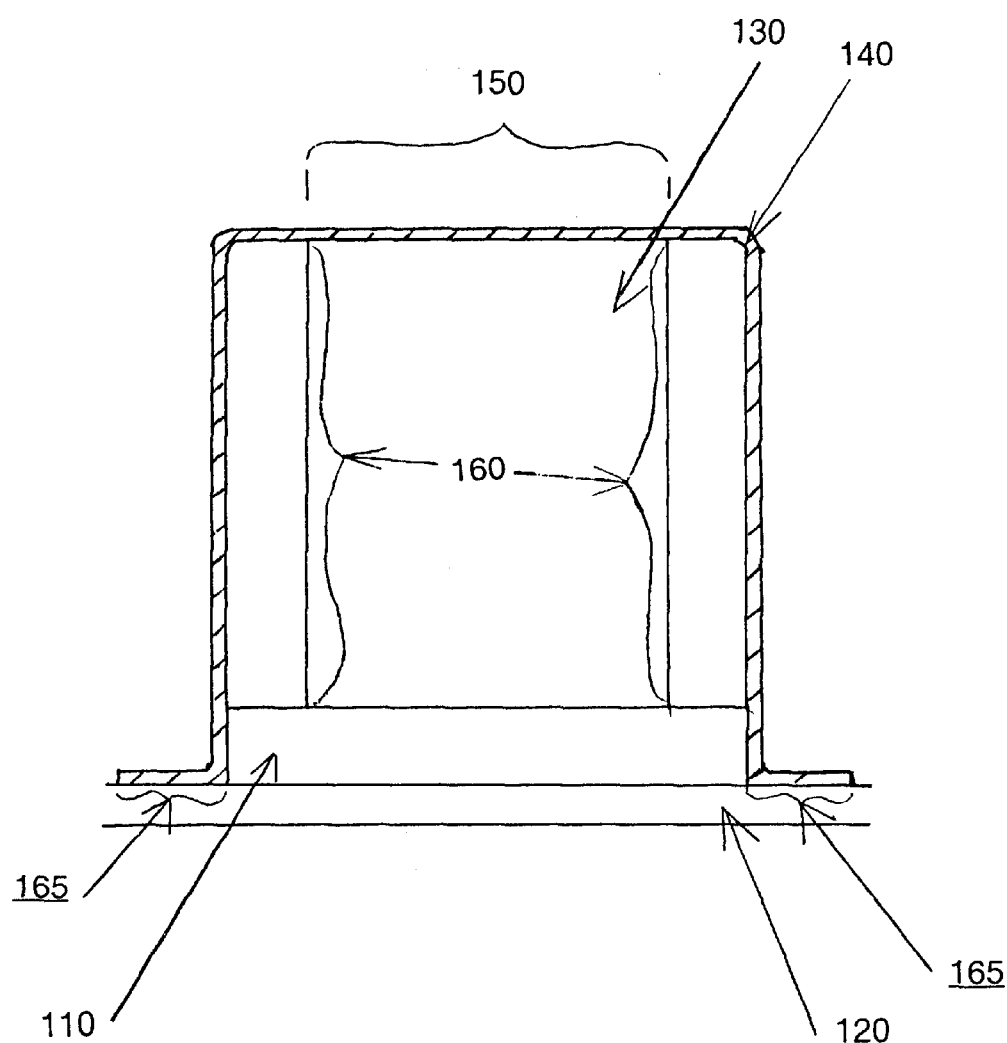

FIG. 1B shows another embodiment of the present invention in which heat sink shroud 140 is in thermal contact with substrate 120 and has been bent in regions 165 in order to provide a greater contact area with substrate 120. This facilitates heat transfer between substrate 120 and heat sink shroud 140. In one embodiment, substrate 120 is at a lower temperature than heat sink shroud 140. Heat can then be transferred from heat sink shroud 140 to substrate 120 where it is dissipated. This facilitates the ability of heat sink apparatus 100 to dissipate heat generated by heat source 110. In another embodiment, substrate 120 is hotter than heat sink shroud 140 resulting in a heat transfer from substrate 120 to heat sink shroud 140. As a result, components directly attached to substrate 120 will have a lower temperature as excess heat will be transferred to heat sink shroud 140 via substrate 120 and dissipated.

Figure 1C:
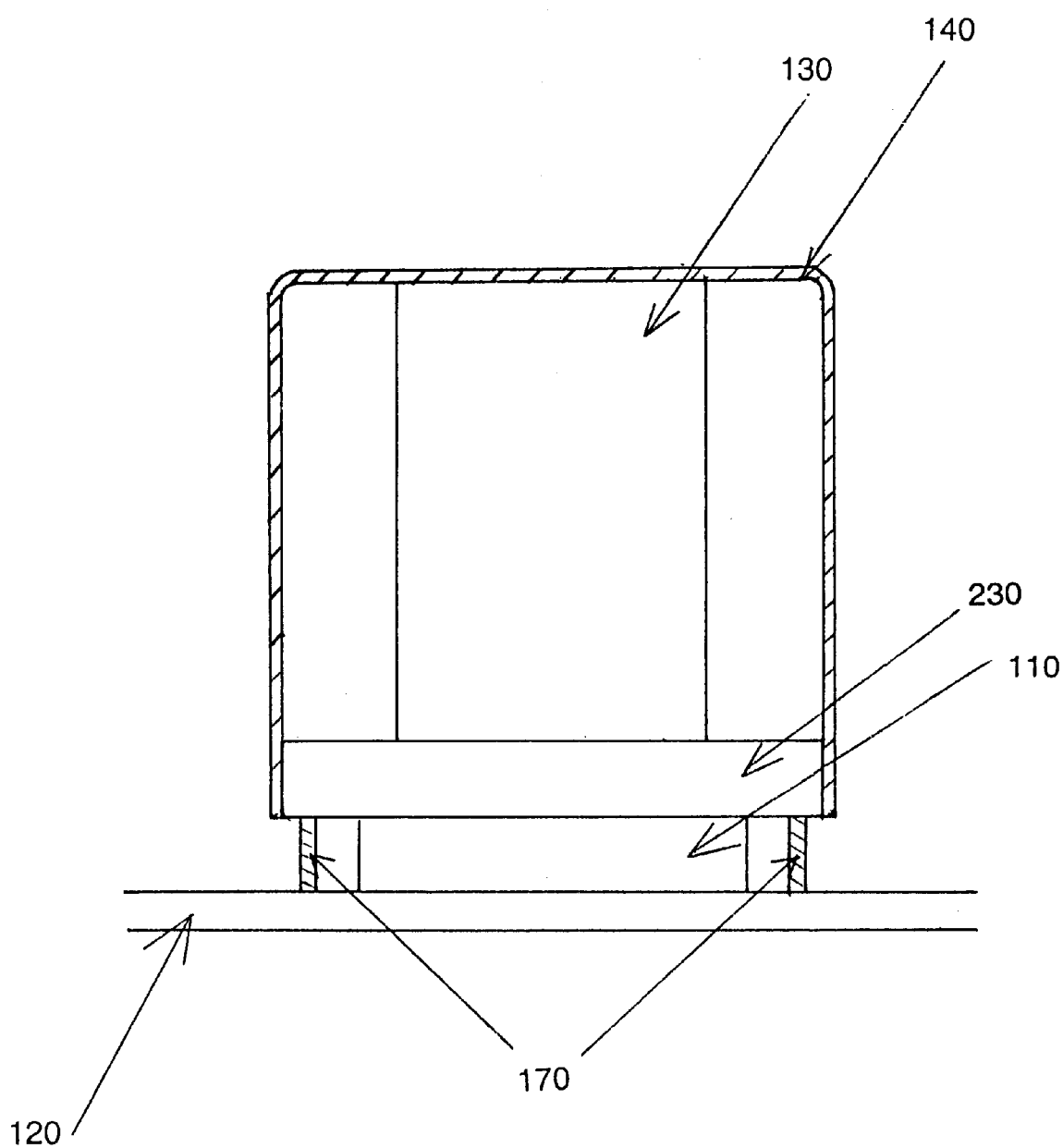

FIG. 1C shows an embodiment of the present invention in which heat source 110 is in thermal contact with a heat sink base 230. Heat sink base 230 transfers heat from heat source 110 to heat sink device 130. As shown in FIG. 1C, heat sink apparatus 100 is coupled with substrate 120 by attachment devices 170. According to embodiments of the present invention, attachments devices 170 can include clips, screws or other devices which are used to attach heat sink apparatus 100 with substrate 120.

Heat dissipation can be further enhanced by coupling a cooling fan (not shown) with heat sink apparatus 100 to increase an ambient flow such as, for example, air across heat sink device 130 and heat sink shroud 140. Heat sink shroud 140 provides heat sink apparatus 100 with a significant amount of surface area for heat dissipation without adding to the overall dimensions of the apparatus. As a result, the present embodiment provides greater surface area for heat dissipation than a similarly sized heat sink apparatus which does not utilize the heat sink shroud to dissipate heat. In other words, the present invention provides a more efficient heat dissipation apparatus.

Additionally, due to its greater efficiency, the present invention allows using a smaller heat sink apparatus to dissipate a given amount of heat. This facilitates placing heat generating components such as computer microprocessors in closer proximity to each other without having to sacrifice cooling performance.

Figure 2:
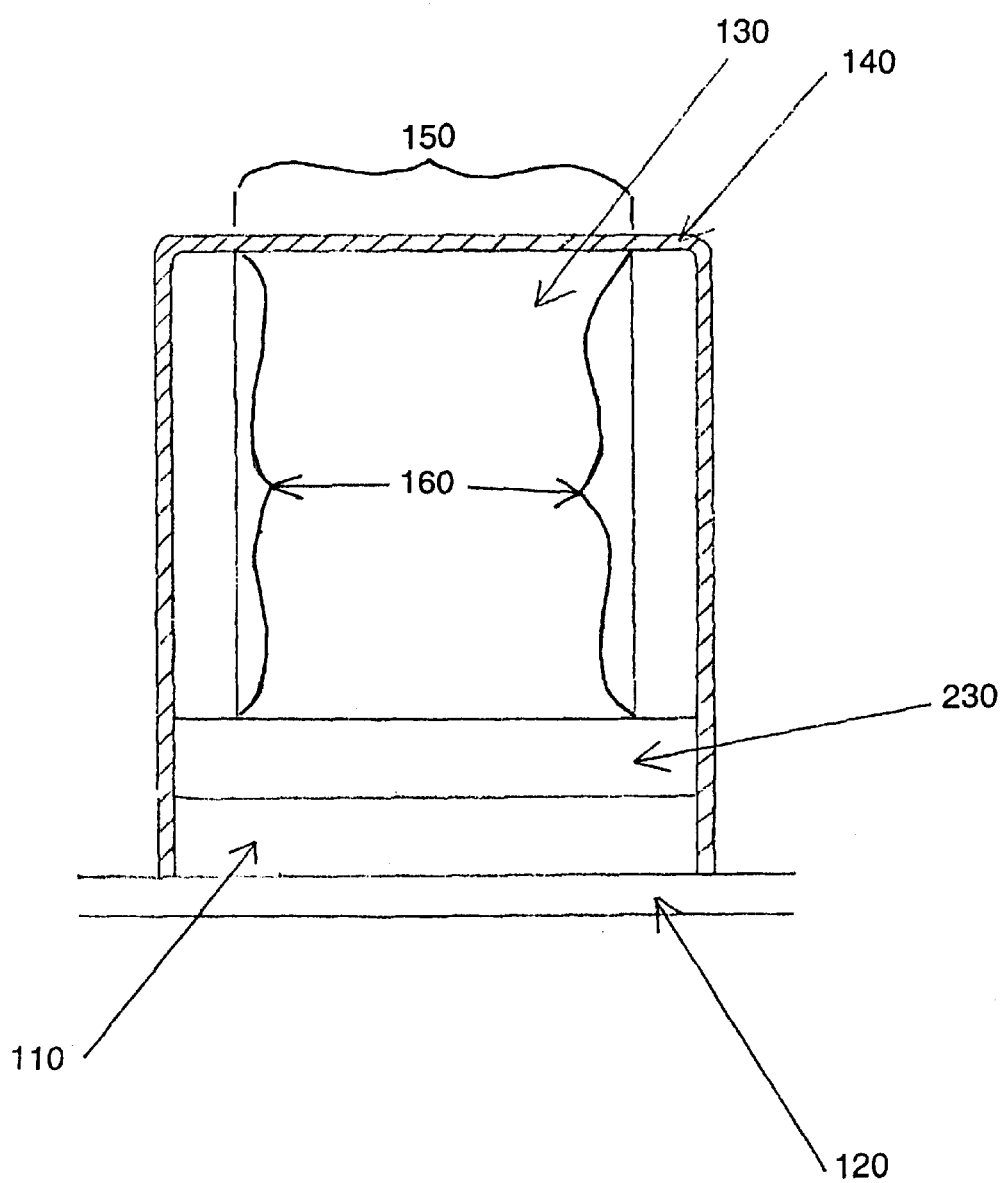
FIG. 2 is a cross section view of an exemplary heat sink apparatus including a base using a heat sink shroud for dissipating heat in accordance with one embodiment of the present invention.

FIG. 2 is a cross section view of an exemplary heat sink apparatus 200 using a heat sink shroud to dissipate heat in accordance with one embodiment of the present invention. Although FIG. 2 shows heat sink shroud 140 coupled with substrate 120 in the present configuration for brevity, it is understood that heat sink shroud 140 may be coupled with substrate 120 as shown in FIGS. 1B and 1C as well. In FIG. 2, heat sink device 130 is further comprised of a base 230 which is adapted to have its bottom surface placed in thermal contact with heat source 110. In one embodiment, base 230 is made of copper. In another embodiment, base 230 is made of aluminum. While the present embodiment recites copper and aluminum, the present invention is well suited to utilize a variety of materials for base 230. Base 230 provides heat sink device 130 with a greater area of thermal contact with heat source 110 and/or an area of greater thermal conductivity to facilitate conducting heat away from heat source 110. However, it is appreciated that in other embodiments of the present invention, base 230 may not contact the entire top surface of heat source 110. In one embodiment, a thermally conductive layer of material such as a high molecular weight interface material thermally couples the top surface of heat source 110 with the bottom surface of base 230. Although the present embodiment recites coupling heat source 110 with base 230 as described above, the present invention is well suited to various other approaches for thermally coupling heat source 110 with base 230. Additionally, a layer of thermally conductive material such as solder, a metal to metal interface, metal mesh etc. may be disposed between base 230 and heat sink device 130 in order to enhance heat transfer.

Heat from heat source 110 is transferred to heat sink device 130 via base 230 and is then transferred to heat sink shroud 140. Heat sink shroud 140 then dissipates the heat into the ambient. In one embodiment, the top surface of heat sink device 130 is thermally coupled with the bottom surface of heat sink shroud 140 in top region 150. In another embodiment, the side surfaces of heat sink device 130 are thermally coupled with the side surfaces of heat sink shroud 140 in side regions 160. Furthermore, in various embodiments of the present invention, thermal conductivity can be enhanced by disposing a thermally conductive material between heat sink device 130 and heat sink shroud 140 such as solder, a metal to metal interface, metal mesh, etc.

Furthermore, in the embodiment of FIG. 2, heat sink shroud 140 is thermally coupled with two side surfaces of base 230. This allows heat sink apparatus 200 to dissipate heat more efficiently by providing additional area for conducting heat away from base 230 via heat sink shroud 140. In one embodiment of the present invention, base 230 and heat sink shroud 140 are soldered together to provide greater mechanical stability to heat sink apparatus 200 and to further enhance heat transfer between heat sink shroud 140 and base 230. In another embodiment, a thermally conductive layer of material thermally couples heat sink shroud 140 to base 230. However, while the present embodiment recites the above described methods for coupling base 230 with heat sink shroud 140, the present invention is well suited to utilize other coupling methods which are capable of enhancing heat transfer from base 230 to heat sink shroud 140.

Figure 3:
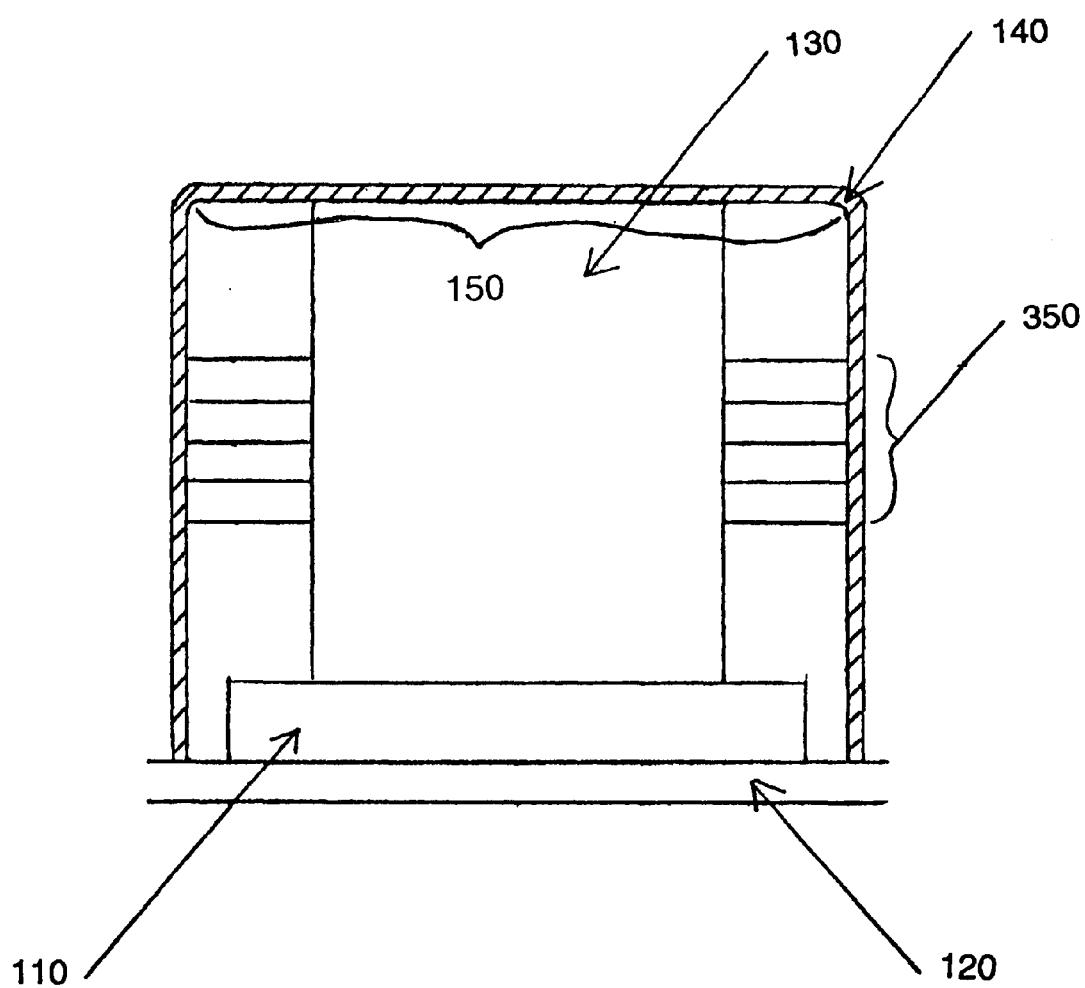
FIG. 3 is a cross section view of an exemplary finned heat sink apparatus using a heat sink shroud for dissipating heat in accordance with one embodiment of the present invention.

FIG. 3 is a cross section view of an exemplary finned heat sink apparatus 300 which uses a heat sink shroud to dissipate heat in accordance with one embodiment of the present invention. Although FIG. 3 shows heat sink shroud 140 coupled with substrate 120 in the present configuration for brevity, it is understood that heat sink shroud 140 may be coupled with substrate 120 as shown in FIGS. 1B and 1C as well. As shown in FIG. 3, heat sink device 130 is adapted to have its bottom surface placed in thermal contact with heat source 110 and is further comprised of a plurality of heat sink fins 350. In the embodiment of FIG. 3, heat sink device 130 is thermally coupled with heat sink shroud 140 in top region 150. Heat generated by heat source 110 is transferred to heat sink device 130 and is then transferred to heat sink shroud 140. Heat sink shroud 140 dissipates the heat by conducting it away from heat sink device 130 and dissipating it into the ambient. Heat sink fins 350 are for conducting heat away from heat sink device 130 and providing increased surface area to facilitate heat dissipation. In one embodiment of the present invention, the thickness of heat sink fins 350 can be varied in order provide a greater capacity for conducting heat away from heat sink device 130. In another embodiment of the present invention, the pitch of heat sink fins 350 is changed in order to increase their surface area and thus enhance their heat dissipation capacity. Heat dissipation can be further enhanced by using a cooling fan (not shown) to direct a greater amount of air across heat sink fins 350.

In accordance with embodiments of the present invention, heat sink fins 350 can be thermally coupled with heat sink shroud 140 to facilitate transferring heat from heat sink device 130 to heat sink shroud 140 where it is dissipated. In one embodiment, a layer of thermally conductive material such as a high molecular weight interface material, a metal to metal interface, solder, metal mesh, etc., is disposed between heat sink fins 350 and heat sink shroud 140 facilitate heat transfer.

Figure 8B:
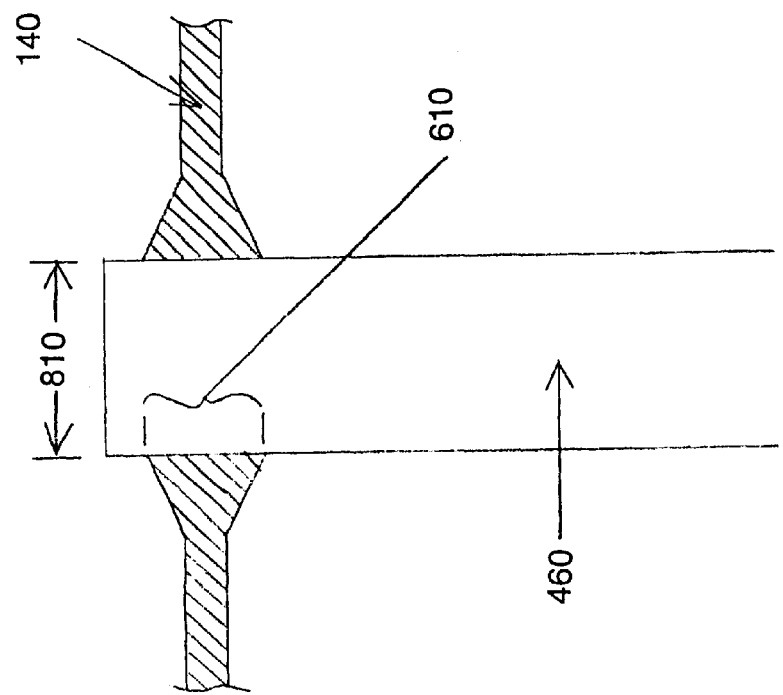
FIGS. 8A and 8B are cross section views of exemplary heat sink shroud flanges used in embodiments of the present invention.
Figure 8A:
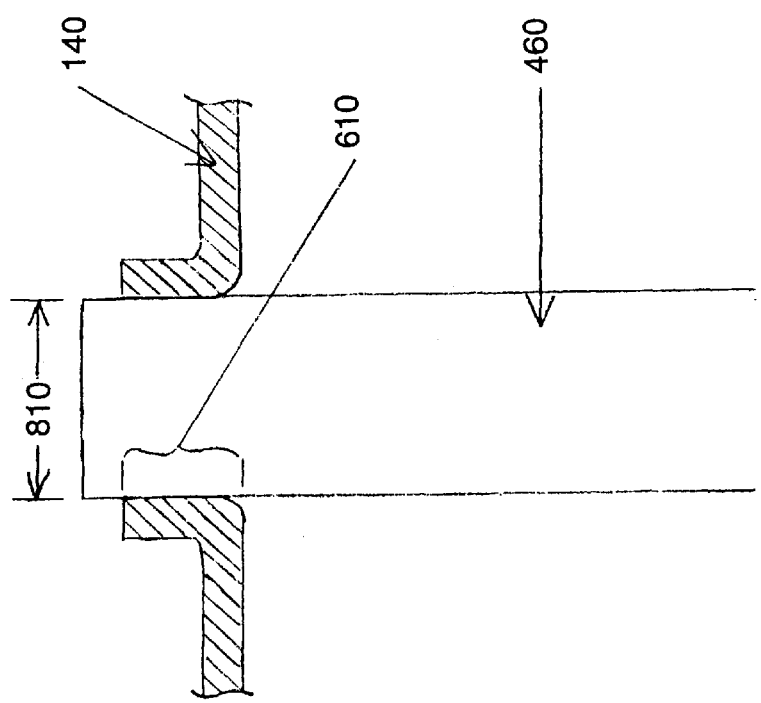

In accordance with embodiments of the present invention, heat sink device 130 may extend through heat sink shroud 140 itself. Referring now to FIGS. 8A and 8B, a hole 810 may be formed in the top surface of heat sink shroud 140. A flange 610 may be formed to provide an area of greater thermal contact between heat sink device 130 and heat sink shroud 140 and thus facilitate heat transfer. In FIG. 8A, a portion of the material surrounding hole 810 has been bent upward to form flange 610. In FIG. 8B, heat sink shroud 140 built to a greater thickness in the region surrounding hole 810 to provide greater surface area for heat transfer. Heat sink device 130 extends through hole 610 and is placed into thermal contact with heat sink shroud 140 via flange 610. In one embodiment, heat transfer between heat sink device 130 and flange 610 is enhanced using a thermally conductive material such as such as a high molecular weight interface material, solder, a metal to metal interface, metal mesh, etc.

Figure 4B:
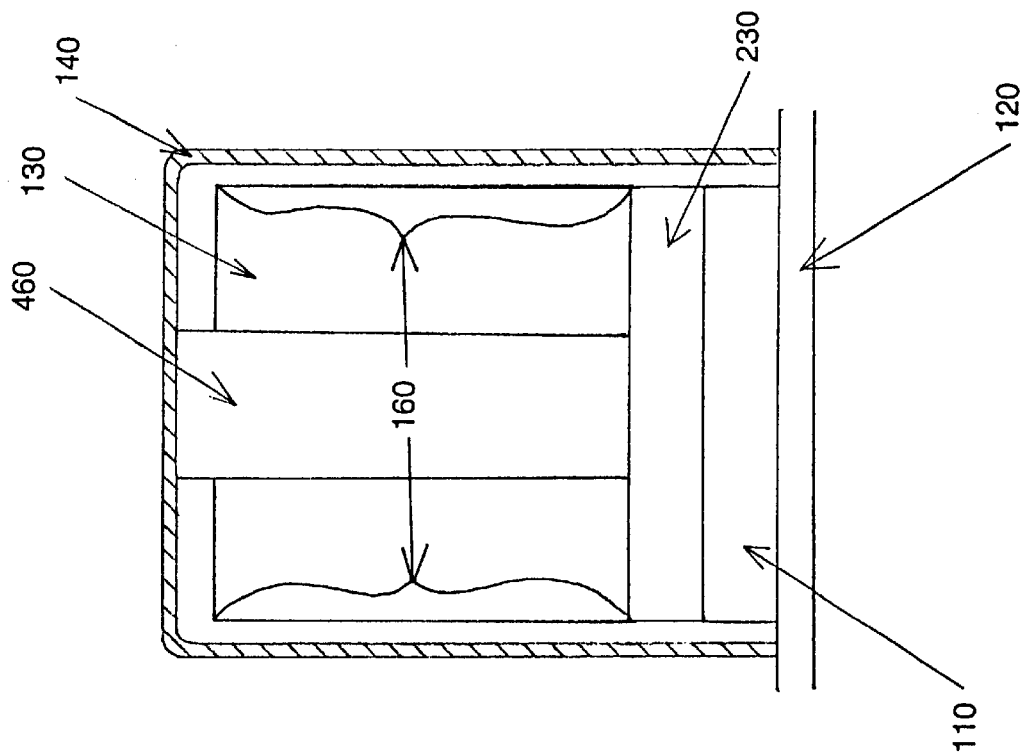
FIGS. 4A and 4B are cross section views of exemplary heat sink devices utilizing heat pipes and which utilize a heat sink shroud for dissipating heat in accordance with embodiments of the present invention.
Figure 4A:
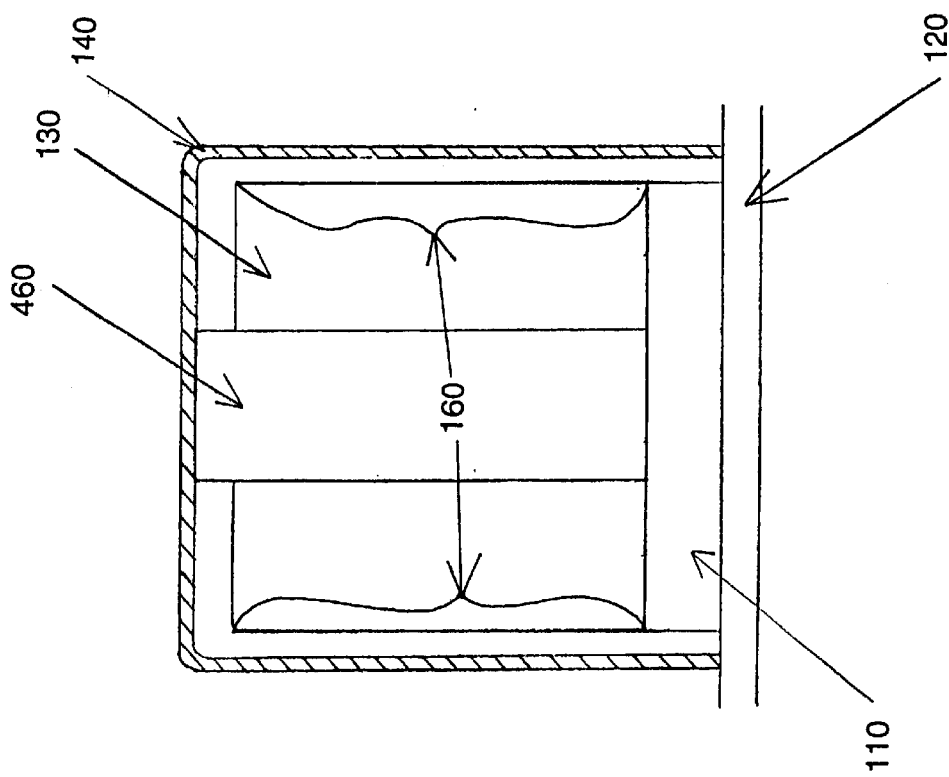

FIGS. 4A and 4B are cross section views of exemplary heat sink devices utilizing heat pipes and which utilize a heat sink shroud for dissipating heat in accordance with embodiments of the present invention. Although FIGS. 4A and 4B show heat sink shroud 140 coupled with substrate 120 in the present configuration for brevity, it is understood that heat sink shroud 140 may be coupled with substrate 120 as shown in FIGS. 1B and 1C as well. Referring to FIG. 4A, heat sink device 130 is further comprised of a heat pipe 460. Heat pipes are passive heat transfer devices with extremely high thermal conductivity. Heat pipes give heat transfer capabilities from one hundred to several thousand times that of an equivalent piece of solid copper. However, it is appreciated that in accordance with embodiments of the present invention, heat pipe 460 may be a solid piece of conductive material such as copper or aluminum.

As shown in the embodiment of FIG. 4A, heat sink device 130 is adapted to be placed in thermal contact with heat source 110. More specifically, heat pipe 460 is adapted to be placed in thermal contact with heat source 110. In so doing, heat pipe 460 greatly enhances the ability of heat sink apparatus 400 to dissipate heat by providing heat sink device 130 with a much greater capacity for transferring heat from heat source 110. In accordance with various embodiments of the present invention, heat pipe 460 is further adapted to be placed in thermal contact with heat sink shroud 140. Heat sink shroud 140 then conducts heat away from heat pipe 460 and dissipates the heat into the ambient. In one embodiment, a layer of thermally conductive material may be disposed between heat pipe 460 and heat sink shroud 140 to facilitate heat transfer. In one embodiment of the present invention, a thermally conductive layer of material such as a high molecular weight interface material thermally couples the top surface of heat source 110 with the bottom surface of heat sink device 130. However, while the present embodiment recites a high molecular weight interface material, the present invention is well suited to various other approaches for coupling heat source 110 with heat sink device 130.

FIG. 4B shows another embodiment of the present invention in which heat sink device 130 further comprises base 230 which is adapted to be placed in thermal contact with heat source 110. In FIG. 4B, heat pipe 460 is adapted to be thermally coupled with base 230. Heat generated by heat source 110 is transferred by base 230 to heat pipe 460. Heat pipe 460 then conducts the heat to heat sink shroud 140. Heat is then transferred from heat pipe 460 to heat sink shroud 140 and dissipated into the ambient. In one embodiment, a layer of thermally conductive material may be disposed between heat pipe 460 and heat sink shroud 140 to facilitate heat transfer. In one embodiment of the present invention, base 230 may be adapted so that heat sink pipe 460 extends through to thermally contact heat source 110 directly. In one embodiment of the present invention, a thermally conductive layer of material such as a high molecular weight interface material thermally couples the top surface of heat source 110 with the bottom surface of heat sink device 130. In one embodiment of the present invention, heat sink shroud 140 is thermally coupled with base 230 to facilitate transferring heat away from heat source 110. For example, in one embodiment of the present invention, heat sink shroud 140 can be soldered to base 230. In another embodiment, a thermally conductive layer of material such as a high molecular weight thermal interface material can be used to thermally couple the heat sink shroud 140 with base 230. While the present embodiment recites these methods for coupling heat sink shroud 140 with base 230, the present invention is well suited to utilize a variety of methods for coupling heat sink shroud 140 with base 230 such as a metal to metal interface, metal mesh, etc.

In various embodiments of FIGS. 4A and 4B, heat sink shroud 140 may be placed in thermal contact with heat sink device 130 along side regions 160 as well. Additionally, heat transfer between heat sink device 130 and heat sink shroud may be enhanced by disposing a layer of thermally conductive material between heat sink device 130 and heat sink shroud 140.

Figure 5A:
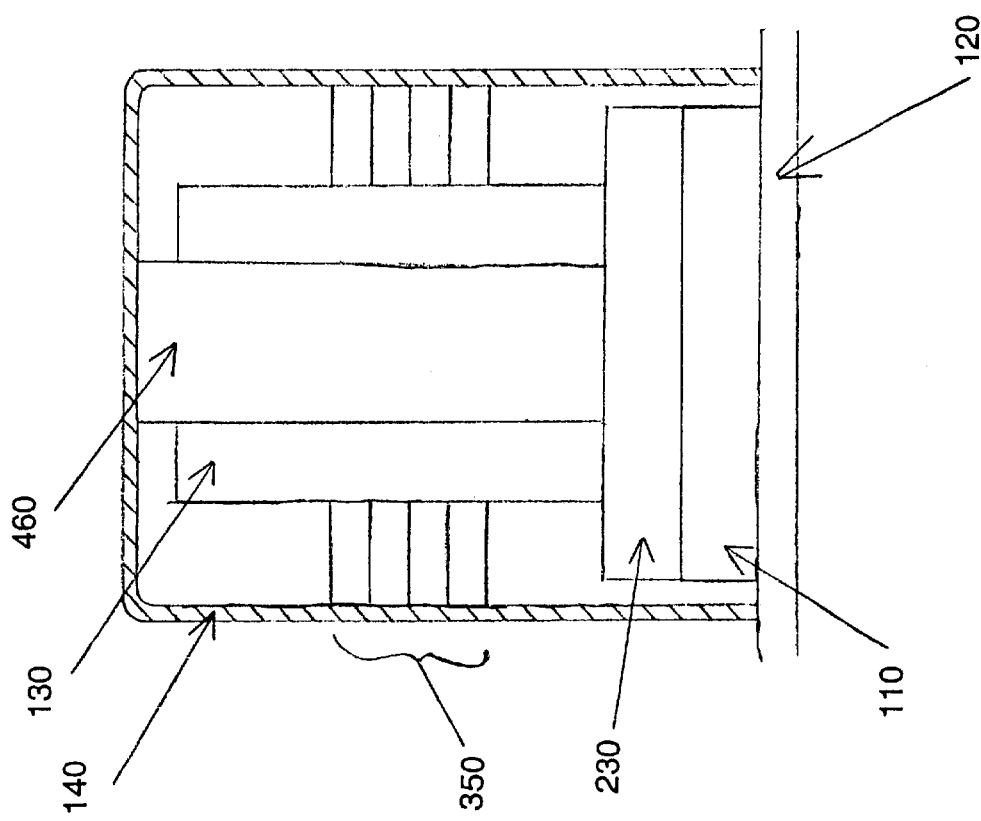
FIGS. 5A and 5B are cross section views of exemplary finned heat sink devices which include heat pipes and utilize a heat sink shroud for dissipating heat in accordance with embodiments of the present invention.
Figure 5B:
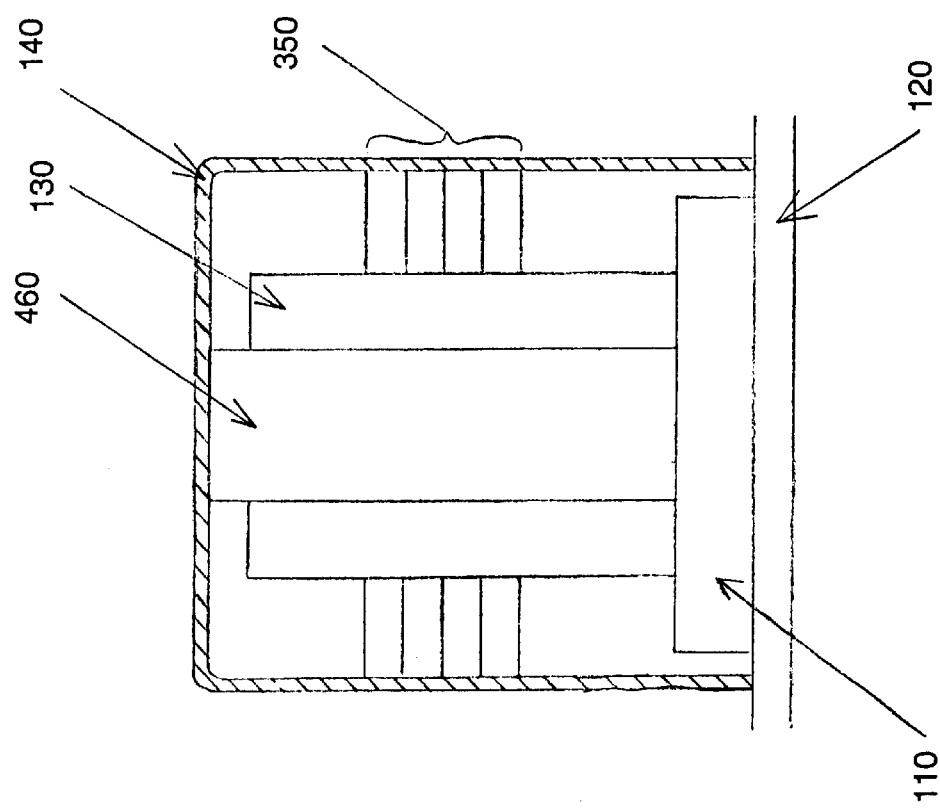

FIGS. 5A and 5B are cross section views of embodiments of the present invention utilizing a finned heat sink device having a heat pipe which uses a heat sink shroud to dissipate heat. Although FIGS. 5A and 5B show heat sink shroud 140 coupled with substrate 120 in the present configuration for brevity, it is understood that heat sink shroud 140 may be coupled with substrate 120 as shown in FIGS. 1B and 1C as well. In the embodiment of FIG. 5A, heat sink device 130 is further comprised of a heat pipe 460 and heat sink fins 350. Heat pipe 460 is adapted to be placed in thermal contact with heat source 110 and for conducting heat away. For example, in one embodiment, the top surface of heat source 110 is placed in thermal contact with the bottom surface of heat pipe 460. Heat sink fins 350 conduct heat away from heat pipe 460 and provide an additional surface area for dissipating the heat into the ambient. Heat pipe 460 is also adapted to be placed in thermal contact with heat sink shroud 140. That is, the top surface of heat pipe 460 is placed in thermal contact with the bottom surface of heat sink shroud 140. Heat sink shroud 140 transfers heat away from heat pipe 460 and dissipates it into the ambient.

In one embodiment, heat sink fins 350 are also thermally coupled with heat sink shroud 140. This facilitates transferring a greater amount of heat to heat sink shroud 140 where it is then dissipated. In one embodiment, a thermally conductive layer of material such as a high molecular weight interface material thermally couples the top surface of heat source 110 with the bottom surface of heat sink device 130. However, the present invention is well suited to use a variety of methods for coupling heat sink fins 350 with heat sink shroud 140 including solder, a metal to metal interface, metal mesh, etc. Heat transfer between heat sink device 130 and heat sink shroud 140 as well as between heat sink fins 350 and heat sink shroud can be facilitated using a layer of thermally conductive material.

In the embodiment of FIG. 5B, heat sink device 130 further comprises a base 230 which is adapted to be thermally coupled with heat source 110. Heat source 110 is thermally coupled with base 230 by placing the top surface of heat source 110 in thermal contact with the bottom surface of base 230. Furthermore, in one embodiment, base 230 can be adapted so that heat pipe 460 extends through base 230 and contacts heat source 110 directly. In one embodiment, a thermally conductive layer of material such as a high molecular weight interface material thermally couples the top surface of heat source 110 with the bottom surface of base 230. Furthermore, in FIG. 5B, heat sink shroud 140 is thermally coupled with base 230. For example, in one embodiment, heat sink shroud 140 can be soldered to base 230. In another embodiment, heat sink shroud 140 can be coupled with base 230 using a high molecular weight thermal interface material. This provides more contact area for transferring heat away from base 230 and thus facilitates cooling heat source 110.

Figure 6:
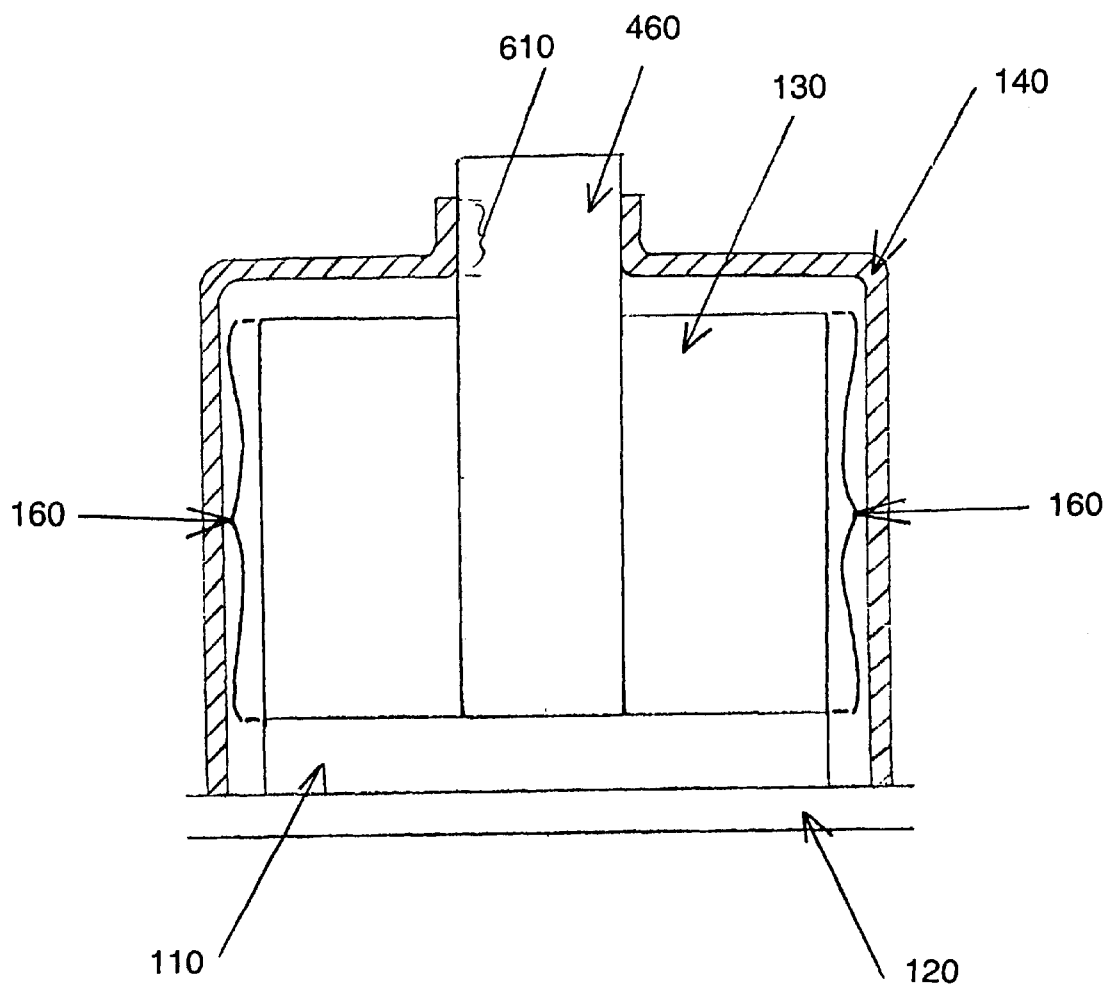
FIG. 6 is a cross section view of an exemplary heat sink apparatus including a heat pipe and using a flange equipped heat sink shroud for dissipating heat in accordance with one embodiment of the present invention.

FIG. 6 is a cross section view of another embodiment of the present invention. Although FIG. 6 shows heat sink shroud 140 coupled with substrate 120 in the present configuration for brevity, it is understood that heat sink shroud 140 may be coupled with substrate 120 as shown in FIGS. 1B and 1C as well. In FIG. 6, heat sink device 130 is thermally coupled with heat source 110 by placing the top surface of heat source 110 in thermal contact with the bottom surface of heat sink device 130. In one embodiment, a thermally conductive layer of material thermally couples heat source 110 with heat sink device 130. Heat generated by heat source 110 is transferred away by heat sink device 130 to heat sink shroud 140. Heat sink shroud 140 transfers heat away from heat sink device 130 and dissipates it into the ambient.

In FIG. 6, heat pipe 460 extends through an opening in the top portion of heat sink shroud 140. Additionally, a portion of heat sink shroud 140 has been configured to form a flange 610 which thermally couples heat sink shroud 140 with heat pipe 460. Specifically, a side surface of heat pipe 460 is placed in thermal contact with a side surface of flange 610. In so doing, the area of contact between heat pipe 460 and heat sink shroud 140 is increased and heat transfer is enhanced. This greatly increases the ability of heat sink shroud 140 to conduct heat away from heat pipe 460 and in turn dissipate heat. In one embodiment of the present invention, a thermally conductive material is disposed between heat pipe 460 and heat sink shroud 140 in order to facilitate heat transfer. In one embodiment, the heat sink shroud 140 can be placed in thermal contact with the sides of heat sink device 130 in side regions 160. Furthermore, heat transfer can be enhanced by adding a layer of thermally conductive material between heat sink device 130 and heat sink shroud 140.

FIGS. 7A and 7B are cross section views of additional embodiments of the present invention utilizing a heat sink shroud to dissipate heat. Although FIGS. 7A and 7B show heat sink shroud 140 coupled with substrate 120 in the present configuration for brevity, it is understood that heat sink shroud 140 may be coupled with substrate 120 as shown in FIGS. 1B and 1C as well. In the embodiment of FIG. 7A, heat sink device 130 is further comprised of a heat pipe 460 and heat sink fins 350. Additionally, heat pipe 460 extends through an opening in the top portion of heat sink shroud 140 as previously described and is thermally coupled with heat sink shroud 140 via flange 610. Heat sink fins 350 conduct heat away from heat pipe 460 and provide additional surface area for dissipating the heat. In one embodiment, heat sink fins 350 also transfer heat to heat sink shroud 140 where it is dissipated. In one embodiment, heat transfer between heat sink fins 350 and heat sink shroud 140 is facilitated using by placing a layer of a thermally conductive material between heat sink fins 350 and heat sink shroud 140.

In the embodiment of FIG. 7B, base 230 is adapted to be thermally coupled with heat source 110 by placing the top surface of heat source 110 in thermal contact with the bottom surface of base 230. In one embodiment; a thermally conductive layer of material thermally couples heat source 110 with heat sink device 130.

In the embodiment of FIG. 7B, heat pipe 460 is adapted to be thermally coupled with base 230 and to conduct heat away by placing the top surface of base 230 in thermal contact with the bottom surface of heat pipe 460. In one embodiment, a thermally conductive layer of material couples base 230 with heat pipe 460. Heat pipe 460 extends through an opening in heat sink shroud 140 and is adapted to be thermally coupled with heat sink shroud 140 via flange 610. Flange 610 provides a greater area of contact between heat pipe 460 and heat sink shroud 140 in order to facilitate heat transfer. Heat sink shroud 140 conducts heat away from heat pipe 460 via flange 610 and dissipates it into the ambient. In one embodiment, heat transfer between heat pipe 460 and flange 610 can be further enhanced by placing a layer of thermally conductive material between flange 610 and heat pipe 460.

In one embodiment of the present invention, heat sink fins 350 are thermally coupled with heat pipe 460. Heat sink fins 350 conduct heat away from heat pipe 460 and dissipate it into the ambient. Heat sink fins 350 are thermally coupled with heat sink shroud 140 in order to conduct heat to heat sink shroud 140 where it is dissipated into the ambient. In one embodiment, heat transfer between heat sink fins 350 and heat sink shroud 140 is facilitated by placing a layer of thermally conductive material between heat sink fins 350 and heat sink shroud 140. Furthermore, in the embodiment of FIG. 7B, heat sink shroud is thermally coupled with base 230 in order to facilitate conducting heat away from base 230 and dissipating it using heat sink shroud 140. In one embodiment, heat sink shroud 140 is soldered to base 230. In another embodiment, heat sink shroud 140 is coupled with base 230 using a thermally conductive layer of material. However, while the present embodiment recites these coupling methods, the present invention is well suited for utilizing a variety of methods for coupling heat sink shroud 140 with base 230. In one embodiment, ambient flow is further increased by coupling a cooling fan (not shown) with heat sink apparatus 700 in order to increase airflow across heat sink apparatus 700.

FIGS. 8A and 8B are cross section views of exemplary heat sink shroud flanges 610 used in embodiments of the present invention. FIG. 8A shows an exemplary flange in which a portion of heat sink shroud 140 has been bent upward in order to form the flange. For example, this can be accomplished by forming a hole in heat sink shroud 140 and bending the surrounding material to form flange 610. Heat pipe 460 is fitted into hole 810 and is thermally coupled with heat sink shroud 140 via flange 610. Flange 610 facilitates heat transfer between heat pipe 460 and heat sink shroud 140 by providing more surface area through which heat may be conducted. In one embodiment, heat transfer between heat pipe 460 and flange 610 is enhanced using a thermal conductive material in the region where heat pipe 460 contacts flange 610.

In FIG. 8B, heat sink shroud 140 is built to a greater thickness in the region surrounding hole 810 to form flange 610. Heat pipe 460 is fitted into hole 810 and is thermally coupled with heat sink shroud 140 via flange 610. Flange 610 facilitates heat transfer between heat pipe 460 and heat sink shroud 140 by providing more surface area through which heat may be conducted. Heat transfer between heat pipe 460 and flange 610 can be enhanced using a thermal conductive material in the region where heat pipe 460 contacts flange 610.

FIG. 9 is a flow chart of a method for dissipating heat in accordance with embodiments of the present invention. For purposes of clarity, the following discussion will utilize the cross section view of FIG. 7B in conjunction with flow chart 900 of FIG. 9, to clearly describe one embodiment of the present invention.

With reference to FIG. 7B, and to step 910 of FIG. 9, heat is transferred from a heat source using a heat sink device. Heat from heat source 110 is conducted using a heat sink device comprising base 230, heat pipe 460, and heat sink fins 350. The bottom surface of base 230 is placed in thermal contact with the top surface heat source 110 and conducts heat away from heat source 110. Heat pipe 460 is adapted to be thermally coupled with base 230 and for conducting heat away. Heat sink fins 350 are thermally coupled with heat pipe 460 and conduct heat away from heat pipe 460 and dissipate it into the ambient.

With reference to FIG. 7B, and to step 920 of FIG. 9, heat is transferred from the heat sink device using a heat sink shroud thermally coupled with the heat sink device. Heat sink shroud 140 is thermally coupled with the heat sink device in order to conduct heat away and dissipate it. In one embodiment, heat sink shroud 140 is thermally coupled with the heat sink device via heat pipe 460, heat sink fins 350, and base 230. Heat sink shroud 140 facilitates dissipating heat from the heat sink device by providing greater surface area for the heat to be dissipated into the ambient. According to embodiments of the present invention, heat sink shroud 140 can be coupled with base 230 using a high molecular weight thermal interface material, soldering, a metal to metal interface, metal mesh, etc., to enhance heat transfer. Additionally, according to embodiments of the present invention, thermal interface material may be used to facilitate heat transfer between fins 350 and heat sink shroud 140 as well as heat pipe 460 and heat sink shroud 140.

Thus, in various embodiments of the present invention, a heat sink apparatus utilizing the heat sink shroud to dissipate heat is described. While the present invention has been described in particular embodiments, it should be appreciated that the present invention should not be construed as limited by such embodiments, but rather construed according to the following claims.

What is claimed is:

1. A heat sink apparatus comprising:
    a heat sink device comprising a heat pipe thermally coupled with a heat source and for transferring heat from said heat source; and
    a heat sink shroud at least partially enclosing said heat source and thermally coupled with said heat sink device, said heat sink shroud for transferring said heat from said heat sink device and for dissipating said heat.

2. The heat sink apparatus of claim 1, wherein said heat sink device further comprises a base adapted to be thermally coupled with said heat source for transferring said heat from said heat source.

3. The heat sink apparatus of claim 2, wherein said heat sink shroud is thermally coupled with said base.

4. The heat sink apparatus of claim 3, wherein said heat sink apparatus further comprises a thermally conductive material disposed between said heat sink shroud and said base for facilitating said thermally coupling said heat sink shroud with said base.

5. The heat sink apparatus of claim 1 wherein said heat sink shroud is thermally coupled with said heat pipe.

6. The heat sink apparatus of claim 5, wherein said heat sink shroud further comprises a flange for thermally coupling said heat sink shroud with said heat pipe.

7. The heat sink apparatus of claim 6, wherein said heat sink apparatus further comprises a thermally conductive material disposed between said flange and said heat pipe for facilitating said thermally coupling of said heat pipe with said heat sink shroud.

8. The heat sink apparatus of claim 1, wherein said heat sink device further comprises a plurality of heat sink fins for dissipating said heat.

9. The heat sink apparatus of claim 8, wherein said heat sink shroud is thermally coupled with said plurality of heat sink fins for transferring said heat from said plurality of heat sink fins.

10. The heat sink apparatus of claim 9, wherein said heat sink apparatus further comprises a thermally conductive material disposed between said heat sink shroud and said plurality of heat sink fins for facilitating said thermally coupling of said heat sink shroud with said plurality of heat sink fins.

11. The heat sink apparatus of claim 1, wherein said heat sink shroud is coupled with a substrate and transfers heat therewith.

12. A method for dissipating heat comprising:
  transferring heat from a heat source using a heat sink device comprising a heat pipe; and
  transferring said heat from said heat sink-device to a heat sink shroud at least partially enclosing said heat source and thermally coupled with said heat sink device, wherein said heat sink shroud facilitates dissipating said heat.

13. The method for dissipating heat as recited in claim 12, wherein said method further comprises transferring said heat from said heat source using a heat sink comprising:
  a base thermally coupled with said heat pipe; and
  a plurality of heat sink fins thermally coupled with said heat pipe.

14. The method for dissipating heat as recited in claim 13, wherein said method further comprises thermally coupling said base with said heat source.

15. The method for dissipating heat as recited in claim 13, wherein said method further comprises thermally coupling said heat sink shroud with said base.

16. The method for dissipating heat as recited in claim 15, wherein said method further comprises disposing a thermally conductive material between said heat sink shroud and said base for transferring said heat from said base to said heat sink shroud.

17. The method for dissipating heat as recited in claim 13, wherein said method further comprises thermally coupling said heat sink shroud with said heat pipe.

18. The method for dissipating heat as recited in claim 17, wherein said method further comprises thermally coupling a flange of said heat sink shroud with said heat pipe.

19. The method for dissipating heat as recited in claim 18, wherein said method further comprises disposing a thermally conductive material between said flange and said heat pipe for transferring said heat from said heat pipe to said flange.

20. The method for dissipating heat as recited in claim 13, wherein said method further comprises thermally coupling said heat sink shroud with said plurality of heat sink fins.

21. The method for dissipating heat as recited in claim 20, wherein said method further comprises disposing a thermally conductive material between said heat sink shroud and said plurality of heat sink fins for transferring said heat from said plurality of heat sink fins to said heat sink shroud.

22. The method for dissipating heat as recited in claim 12, wherein said method further comprises coupling said heat sink shroud with a substrate and transferring heat therewith.

23. A heat dissipation system comprising:
  heat transferring means for transferring heat from a heat source coupled with a substrate; and
  means for coupling said heat transferring means to said substrate, wherein said means for coupling said heat transferring means to said substrate at least partially encloses said heat source and is thermally coupled with said heat transferring means, and wherein said means for coupling said heat transferring means to said substrate dissipates heat from said heat source.

24. The heat dissipation system as recited in claim 23, wherein said system further comprises means for thermally coupling said heat transferring means with said heat source.

25. The heat dissipation system as recited in claim 23, wherein said system further comprises a flanging means for facilitating said thermally coupling said means for coupling said heat transferring means to said substrate with said heat transferring means.

26. The heat dissipation system as recited in claim 23, wherein said system further comprises a transferring material means disposed between said heat transferring means and said means for coupling said heat transferring means to said substrate for facilitating said thermally coupling said means for coupling said heat transferring means to said substrate with said heat transferring means.

* * * * *